United States Patent
Cobianu et al.

(10) Patent No.: US 7,891,252 B2
(45) Date of Patent: Feb. 22, 2011

(54) METHOD FOR SENSOR FABRICATION AND RELATED SENSOR AND SYSTEM

(75) Inventors: Cornel Cobianu, Bucharest (RO); Viorel Avramescu, Bucharest (RO); Ion Georgescu, Bucharest (RO); Stefan-Dan Costea, Bucharest (RO)

(73) Assignee: Honeywell International Inc., Morristown, NJ (US)

( * ) Notice: Subject to any disclaimer, the term of this patent is extended or adjusted under 35 U.S.C. 154(b) by 94 days.

(21) Appl. No.: 12/362,741

(22) Filed: Jan. 30, 2009

(65) Prior Publication Data
US 2009/0193903 A1 Aug. 6, 2009

(51) Int. Cl.
*G01L 7/00* (2006.01)
(52) U.S. Cl. .......................................... 73/756; 310/324
(58) Field of Classification Search ........................ None
See application file for complete search history.

(56) References Cited

U.S. PATENT DOCUMENTS

| | | | | |
|---|---|---|---|---|
| 4,426,768 A | * | 1/1984 | Black et al. | 438/51 |
| 7,148,610 B2 | * | 12/2006 | Jacot et al. | 310/364 |
| 2005/0231067 A1 | | 10/2005 | Cook et al. | |
| 2006/0075820 A1 | | 4/2006 | Cobianu et al. | |
| 2006/0086188 A1 | | 4/2006 | Avramescu et al. | |
| 2007/0114889 A1 | | 5/2007 | Cobianu et al. | |
| 2007/0126072 A1 | | 6/2007 | Cobianu et al. | |
| 2007/0164633 A1 | | 7/2007 | Cobianu et al. | |
| 2007/0164859 A1 | | 7/2007 | Cobianu et al. | |
| 2007/0194662 A1 | * | 8/2007 | Sano et al. | 310/324 |
| 2008/0067892 A1 | * | 3/2008 | Chiba et al. | 310/314 |
| 2008/0229831 A1 | | 9/2008 | Serban et al. | |
| 2008/0265711 A1 | | 10/2008 | Kumar et al. | |

FOREIGN PATENT DOCUMENTS

WO  WO 2007/061831 A1  5/2007

* cited by examiner

*Primary Examiner*—Andre J Allen
(74) *Attorney, Agent, or Firm*—Munck Carter, LLP (57) ABSTRACT

A method includes forming multiple trenches in a first wafer, forming a sensor structure on a first surface of a second wafer, and bonding the first wafer and the second wafer. The method also includes etching a second surface of the second wafer to form a sensor diaphragm in the second wafer. The method further includes removing a portion of the first wafer by cutting the first wafer in multiple areas of the first wafer associated with the trenches. A sensor includes a substrate and a surface acoustic wave (SAW) resonator on a first surface of the substrate. The sensor also includes a bonding pad electrically coupled to the SAW resonator and a notch formed in a second surface of the substrate. The sensor further includes a cover separated from the first surface of the substrate by a spacer. The SAW resonator is located between the cover and the substrate.

20 Claims, 5 Drawing Sheets

METHOD FOR SENSOR FABRICATION AND RELATED SENSOR AND SYSTEM

CROSS-REFERENCE TO RELATED APPLICATIONS

This application claims priority under 35 U.S.C. §119 to Romanian Patent Application No. a/2008-00091 filed on Feb. 1, 2008.

TECHNICAL FIELD

This disclosure relates generally to sensors and more specifically to a method for sensor fabrication and related sensor and system.

BACKGROUND

Wireless and wired sensors are used in a wide variety of industries. For example, wireless pressure sensors are routinely used in automobiles and other vehicles, such as to monitor the pressure of tires on the vehicles. Also, the tires of a vehicle can often suffer from excessive temperatures, such as due to overloading of the vehicle or high temperatures in some regions of the world. Wireless temperature sensors can be used in a vehicle to monitor the temperatures of its tires.

Tire monitoring systems routinely need to be low in cost and use sensors that are wireless, small in size, and highly reliable with low drift. Existing tire pressure monitoring systems often use piezoresistive pressure sensors. These types of monitoring systems often require the use of radio frequency ("RF") electronics as well as signal conditioning and processing circuitry. These types of monitoring systems also often require the use of batteries to power the sensors and related electronics and circuitry. However, these types of monitoring systems are often not attractive due to the weigh of the systems and due to the limited lifetime of their batteries, which can be discharged much faster in the harsh environment of vehicle tires.

SUMMARY

This disclosure provides a method for sensor fabrication and related sensor and system.

In a first embodiment, a method includes forming multiple trenches in a first wafer, where the first wafer has multiple locally thinned areas associated with the trenches. The method also includes forming a sensor structure on a first surface of a second wafer, where the second wafer includes a piezoelectric material. The method further includes bonding the first wafer and the second wafer and etching a second surface of the second wafer to form a sensor diaphragm in the second wafer. In addition, the method includes removing a portion of the first wafer by cutting the locally thinned areas of the first wafer.

In particular embodiments, the first wafer is glass, and the second wafer is quartz.

In other particular embodiments, bonding the first wafer and the second wafer includes depositing a spacer material on at least one of the wafers, pressing the wafers so that the spacer material contacts both wafers, and curing the spacer material. The spacer material could include frit glass paste that is cured into frit glass. The frit glass could have a thermal coefficient of expansion at least approximately equal to average thermal coefficients of expansion for the first and second wafers. The spacer material could also be deposited using direct printing.

In yet other particular embodiments, etching the second surface of the second wafer includes forming a mask layer over the second surface of the second wafer, placing the first and second wafers in a protective fixture so that only the second surface of the second wafer remains exposed, and etching the exposed second surface of the second wafer. Forming the mask layer could include depositing a layer of silicon using plasma enhanced chemical vapor deposition and patterning the layer of silicon. Also, the protective fixture could include a Teflon fixture and an O-ring. In addition, etching the exposed second surface of the second wafer could include performing a deep wet etch using an etching solution comprising HF and HCl.

In still other particular embodiments, removing the portion of the first wafer includes removing a strip of the first wafer, where the strip is formed by cutting completely through two locally thinned areas of the first wafer. Multiple sensor structures could be formed on the second wafer, and the multiple sensor structures could include multiple bonding pads. Removing the strip of the first wafer could expose portions of at least some of the bonding pads, and the method could also include forming conductive bumps on the exposed bonding pads.

In additional particular embodiments, multiple sensor structures are formed on the second wafer. Also, the method further includes cutting through the first wafer and partially into the second wafer and separating the multiple sensor structures from one another.

In a second embodiment, a sensor includes a piezoelectric substrate, a surface acoustic wave (SAW) resonator on a first surface of the substrate, and a bonding pad electrically coupled to the SAW resonator. The sensor also includes a cover separated from the first surface of the substrate by a spacer, where the SAW resonator is located between the cover and the substrate. The sensor further includes a notch formed in a second surface of the substrate.

In a third embodiment, a system includes an antenna and a sensor. The sensor includes a piezoelectric substrate and a surface acoustic wave (SAW) resonator on a first surface of the substrate. The sensor also includes a cover separated from the first surface of the substrate by a spacer, where the SAW resonator is located between the cover and the substrate. The sensor further includes a notch formed in a second surface of the substrate. In addition, the sensor includes multiple bonding pads electrically coupled to the SAW resonator and a conductive bump on each of the bonding pads, where the conductive bumps are in electrical contact with the antenna.

In particular embodiments, the system also includes a monitor configured to receive wireless signals from the antenna and a controller configured to analyze data associated with the wireless signals received by the monitor. The sensor may be associated with a vehicle tire and include a temperature sensor and/or a pressure sensor.

Other technical features may be readily apparent to one skilled in the art from the following figures, descriptions, and claims.

BRIEF DESCRIPTION OF THE DRAWINGS

For a more complete understanding of this disclosure, reference is now made to the following description, taken in conjunction with the accompanying drawings, in which.

DETAILED DESCRIPTION

FIGS. 1 through 5, discussed below, and the various embodiments used to describe the principles of the present invention in this patent document are by way of illustration only and should not be construed in any way to limit the scope of the invention. Those skilled in the art will understand that the principles of the invention may be implemented in any type of suitably arranged device or system.

Figure 1:
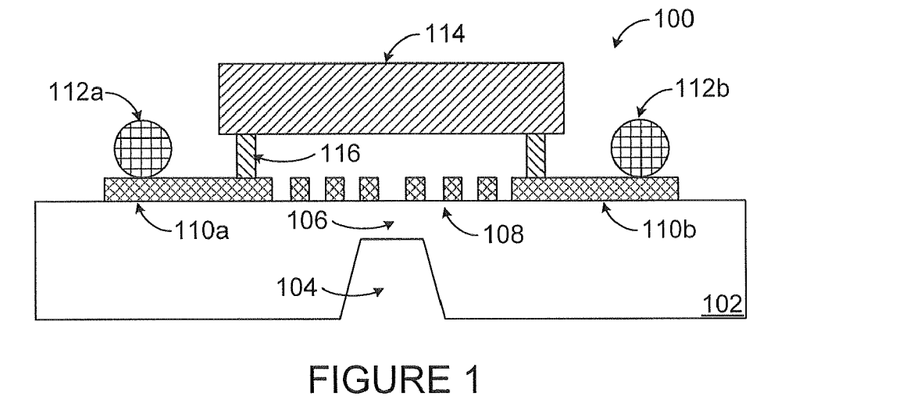
FIG. 1 illustrates an example sensor according to this disclosure.

FIG. 1 illustrates an example sensor 100 according to this disclosure. The embodiment of the sensor 100 shown in FIG. 1 is for illustration only. Other embodiments of the sensor 100 could be used without departing from the scope of this disclosure.

In general, this embodiment of the sensor 100 is a surface acoustic wave (SAW) based sensor that can be used in various applications. For example, the sensor 100 could be used as a pressure and/or temperature sensor in a vehicle's tire monitoring system, such as when the sensor 100 is placed in the vehicle's tire or within a valve stem of the tire. The sensor 100 may be a low cost, wireless sensor and can eliminate the need for a battery and on-chip RF electronics.

In this example, the sensor 100 includes a piezoelectric substrate 102. The piezoelectric substrate 102 generally represents any suitable structure on which other components of the sensor 100 are formed or carried. The substrate 102 could, for example, represent quartz or other piezoelectric material. In this example, the substrate 102 has a notch 104, which forms a diaphragm 106 in the substrate 102. Among other things, the diaphragm 106 allows the sensor 100 to detect changes in pressure, temperature, or other conditions.

The sensor 100 also includes one or more SAW devices 108 formed on the substrate 102. The SAW device(s) 108 in this example could represent one or more SAW resonators, each of which includes two sets of conductive fingers (where one set of conductive fingers is interleaved with the other set of conductive fingers). Each SAW device 108 could be formed using any suitable material(s), such as highly-doped polysilicon or metal. Each SAW device 108 could also be formed in any suitable manner, such as by etching the highly-doped polysilicon or metal using a mask. In addition, each SAW device 108 implemented as a SAW resonator could include a number of conductive fingers.

Two bonding pads 110a-110b are electrically coupled to the one or more SAW devices 108. The bonding pads 110a-110b represent areas where conductive bumps 112a-112b can be formed in the sensor 100. The conductive bumps 112a-112b allow the sensor 100 to be electrically coupled to an external component, such as an antenna. The bonding pads 110a-110b and the conductive bumps 112a-112b could be formed using any suitable material(s), such as aluminum bonding pads and gold conductive bumps. The bonding pads 110a-110b and the conductive bumps 112a-112b could also be formed in any suitable manner, such as by etching aluminum using a mask to form the bonding pads and by depositing gold stud bumps starting from gold wires to form the conductive bumps.

A cover 114 is placed over the one or more SAW devices 108. The cover 114 is spaced apart from the SAW devices 108 using one or more spacers 116, which in this example are formed over the bonding pads 110a-110b (although the spacers 116 could be formed in other areas, such as over the substrate 102 next to the bonding pads). The cover 114 and the one or more spacers 116 help to protect the SAW devices 108 from the external environment, such as the harsh environment of a vehicle tire. For example, the cover 114 and the one or more spacers 116 could hermetically seal the area around the one or more SAW devices 108 from the external environment, thereby forming a pressure chamber within the sensor 100. The cover 114 and the one or more spacers 116 could be formed using any suitable material(s), such as a glass or quartz for cover fabrication and frit glass for spacer fabrication. The cover 114 and the one or more spacers 116 could also be formed in any suitable manner, such as by grinding glass or quartz to form the cover and screen printing or direct printing frit glass paste to form the spacers. In some embodiments, the spacers 116 have a thermal coefficient of expansion (TCE) that equals or approximates the TCE of a glass cover 112 or that approximates the average TCE of a piezoelectric cover 112 (in two perpendicular directions due to their anisotropic material properties) and that equals or approximates the average TCE of the piezoelectric substrate 102 (in two perpendicular directions). In particular embodiments, the spacers 116 are formed from frit glass, and the TCE of the frit glass can be established during frit glass paste formulation.

Although FIG. 1 illustrates one example of a sensor, various changes may be made to FIG. 1. For example, the layout and arrangement of components in the sensor 100 could be altered according to particular needs. Also, the sizes, shapes, and relative positions of the components in the sensor 100 are for illustration only.

FIGS. 2A through 2F illustrate an example technique for forming sensors according to this disclosure. The technique shown in FIGS. 2A through 2F is for illustration only. Other techniques could be used to fabricate one or more sensors without departing from the scope of this disclosure. Also, for ease of illustration and explanation, the technique shown in FIGS. 2A through 2F is described with respect to the sensor 100 of FIG. 1. The technique shown in FIGS. 2A through 2F could be used to form any suitable sensor, and the sensor 100 of FIG. 1 could be formed using any suitable technique.

The sensors fabricated using this technique (such as multiple sensors 100) may operate based on the piezoelectric effect, so the sensors may be sensitive to strain. As a result, low stress precautions can be taken during fabrication and packaging of the sensors. For example, the use of metal covers can be eliminated (although metal covers could still be used depending on particular implementations). Also, mismatches between the TCE of different components can be reduced or eliminated. In addition, whenever possible, the packaging materials can be designed to avoid mechanical stresses of thermal origins.

Figure 2A:
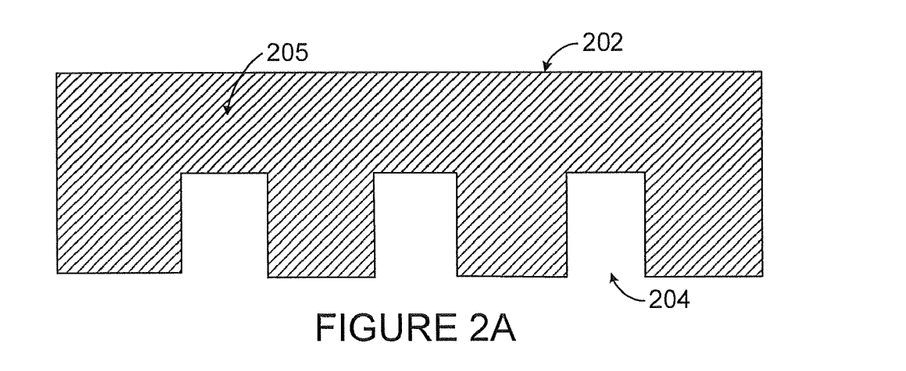
FIGS. 2A through 2F illustrate an example technique for forming sensors according to this disclosure.

As shown in FIG. 2A, a cover wafer 202 is etched to form multiple trenches 204. The cover wafer 202 represents a wafer of material that is used to form the cover 114 for multiple sensors 100. The cover wafer 202 could be formed from any suitable material(s), such as a circular quartz or glass wafer. In particular embodiments, the cover wafer 202 can be selected to have the same diameter and thickness as a sensor wafer (which is used to form the substrate 102 of multiple sensors 100). The cover wafer 202 could also have the same or similar TCE as the material(s) used to form the spacers 116 in the sensors 100. Further, the cover wafer 202 could be etched in any suitable manner, such as by sawing the trenches 204 across the entire cover wafer 202 using a disc. In addition, the trenches 204 could have any suitable width, depth, and spacing, such as a depth of 30-50 µm. The formation of the trenches 204 in the cover wafer 202 leads to the creation of locally thinned areas 205 of the cover wafer 202. These locally thinned areas 205 are located above the trenches 204 in FIG. 2, and these areas 205 have a thickness less than the thickness non-etched areas of the cover wafer 204.

Figure 2B:
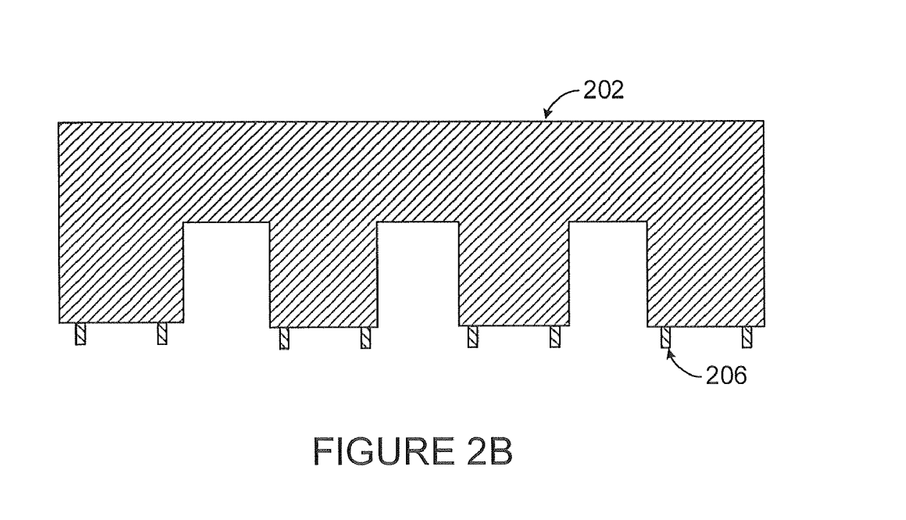

As shown in FIG. 2B, spacer material 206 is deposited on the cover wafer 202. The spacer material 206 is used to form the spacers 116 in the sensors 100. The spacer material 206 could represent any suitable material(s), such as frit glass paste having a TCE that matches or approximates the average TCE of the cover wafer 202 and the average TCE of the sensor wafer. In some embodiments, the frit glass paste is formulated to have a firing temperature below the Curie temperature of quartz. The spacer material 206 can also be deposited on the cover wafer 202 in any suitable manner, such as by screen printing or direct printing. In addition, the spacer material 206 can be deposited to any suitable height, such as 15-50 µm.

Figure 2C:
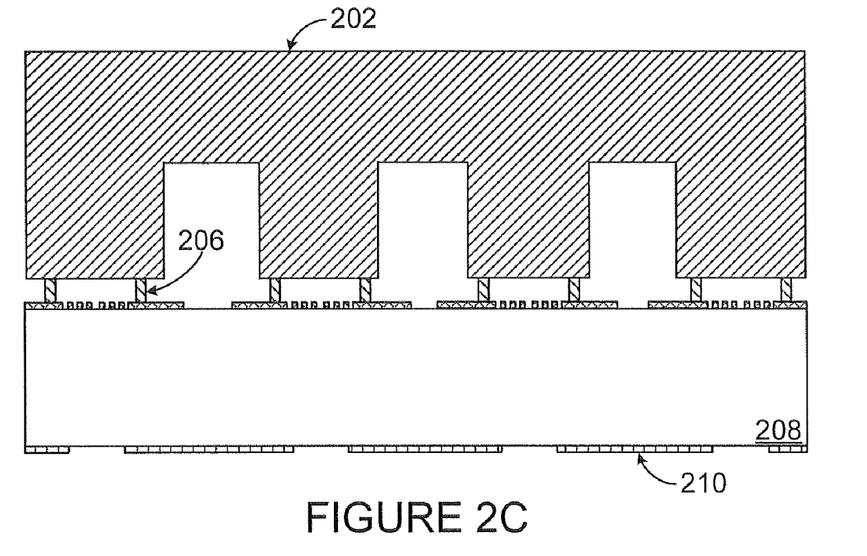

As shown in FIG. 2C, a sensor wafer 208 is processed to form SAW resonators, bonding pads, and other sensor structures on one surface of the sensor wafer 208. The opposing side of the sensor wafer 208 is masked using a masking layer 210, which can be deposited and then patterned. The masking layer 210 is used to facilitate formation of notches 104 in the sensors 100. The sensor wafer 208 could be formed using any suitable material(s), such as a circular quartz wafer. Also, the masking layer 210 could be formed using any suitable material(s), such as metal (like chromium, gold, or thick nickel) or silicon (like thick silicon layers formed using low temperature plasma enhanced chemical vapor deposition). The other surfaces of the sensor wafer 208 (including the one containing the SAW resonators and bonding pads) can be protected during formation and patterning of the masking layer 210.

Also as shown in FIG. 2C, the cover wafer 202 is aligned with and bonded to the sensor wafer 208. This may include ensuring that the spacer material 206 is properly aligned with the bonding pads on the surface of the sensor wafer 208 (although the spacer material 206 could also contact the sensor wafer 208). Once aligned properly, the wafers 202 and 208 undergo a bonding treatment to bond the wafers together via the spacer material 206. For example, when the spacer material 206 represents frit glass paste, the wafers can undergo firing (such as at temperatures below 400° C.) to cure the frit glass paste into frit glass. The frit glass paste can be fired so that a solid frit glass frame surrounds at least a portion of each sensor 100 on the sensor wafer 208. Also, the trenches 204 in the cover wafer 202 remain above portions of the bonding pads on the sensor wafer 208. In this way, sealed pressure chambers are formed for all of the sensors 100 on the sensor wafer 208 simultaneously. In particular embodiments, firing of frit glass paste can occur with oxygen in the ambient environment, and pure and dry nitrogen or a high vacuum can be used as the ambient environment during alignment and thermal consolidation of the frit glass paste. The firing may take place during frit glass paste consolidation on the cover wafer 202 before final alignment and bonding in nitrogen or a vacuum.

Figure 2D:
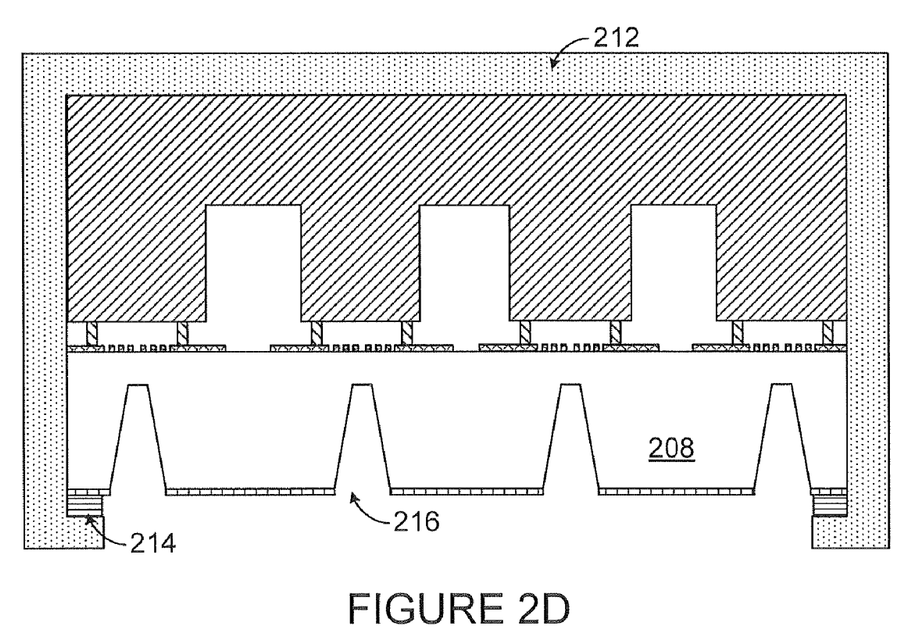

As shown in FIG. 2D, after the wafers are bonded together, the bonded wafers are placed in a protective fixture 212, and an O-ring 214 is used to seal the protective fixture 212 against the sensor wafer 208. The sensor wafer 208 is then etched to form multiple notches 216, which may represent the notches 104 in the sensors 100. The protective fixture 212 and the O-ring 214 protect the other surfaces of the bonded wafers from the etching performed on the exposed surface of the sensor wafer 208. For example, the protective fixture 212 could represent a Teflon fixture, and the O-ring 214 could represent a Viton O-ring. Also, any suitable etch(es) could be performed to etch the sensor wafer 208, such as a deep wet etch using hydrogen fluoride-based solutions (like $NH_4F/HF$ or HF/HCl in a 10/1 ratio). It can be noted that HF/HCl solutions may further improve surface roughness of the etched side of the sensor wafer 208. The temperature of the etching solution can be controlled depending on the desired etch rate and required diaphragm thickness uniformity. Once the etch is complete, the bonded wafers can be removed from the protective fixture 212, and the masking layer 210 can be removed. Other etching techniques could also be used, such as dry plasma etching, laser drilling, ultrasonic etching, and pure mechanical drilling (where the protective fixture 212 may not be needed during fabrication of the notches 216).

Figure 2E:
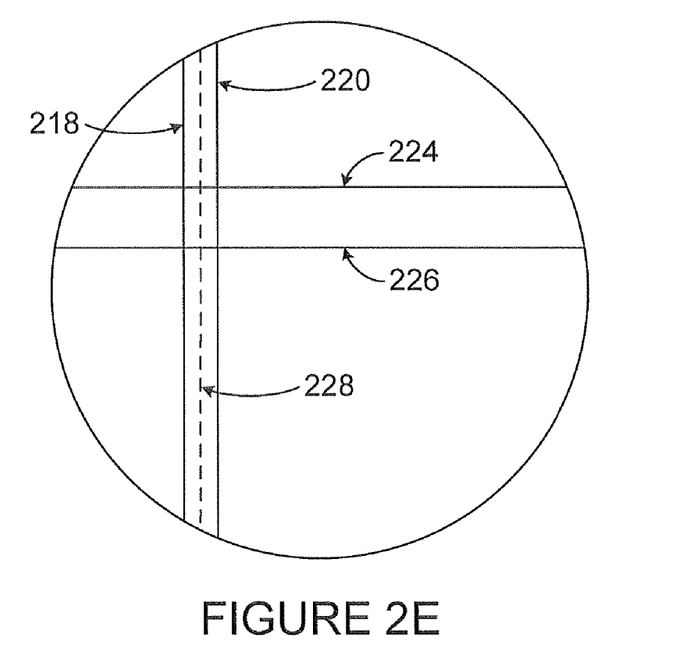
Figure 2F:
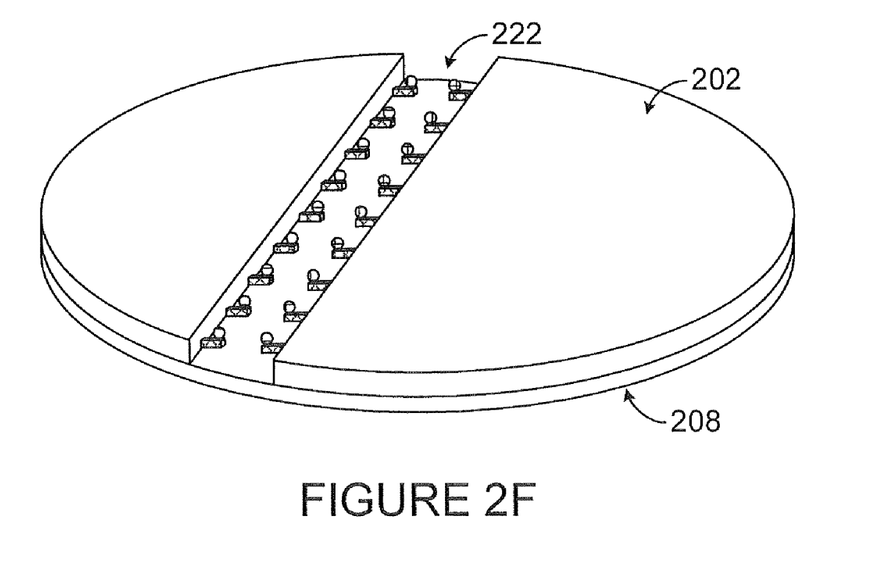

As shown in FIGS. 2E and 2F, a cutting sequence can be used to expose the sensors' bonding pads for application of conductive bumps and to "dice" or separate the sensors from one another. For example, the bonded wafers can be placed on a plastic foil support or other support, and one or both wafers can be sawed using a rotating disc. In this example, cuts 218-220 can be made in the cover wafer 202 to remove a single strip 222 of the cover wafer 202 between multiple sensors 100 being formed. These two cuts could be designed to saw completely through locally thinned areas 205 of the cover wafer 202, which means the cuts can be designed to be less deep (since the locally thinned areas 205 are located over trenches 204 that have already been formed in the cover wafer 202). In this way, the cuts 218-220 would not cut into the sensor wafer 208 or the bonding pads on the surface of the sensor wafer 208. The same two cuts can be repeated to remove multiple strips 222 of the cover wafer 202. At this point, a bumping process could occur to place gold or other conductive bumps on the exposed bonding pads.

After that, additional cuts to the wafers may occur in order to separate the sensors 100 being formed. For example, cuts 224-226 are used to saw through the cover wafer 202 and partially into the sensor wafer 208, and cut 228 is used to saw partially into the sensor wafer 208 below a removed strip 222 of the cover wafer 202. These cuts can be repeated as necessary to partially cut the sensor wafer 208 between each sensor 100 being formed. Once the cuts are completed, the sensors 100 can be completely separated from one another using a heavy rolling process, where a heavy mass is rolled over the bonded wafers to separate the sensors 100 along the partial cuts through the sensor wafer 208. At this point, the sensors 100 can be mounted on printed circuit boards and attached to wired connections or wireless antennas or used in any other suitable manner. In particular embodiments, the sensors 100 formed in this manner may satisfy the automotive industry's restrictions for use in harsh chemical environments with high temperatures and vibrations.

Although FIGS. 2A through 2F illustrate one example of a technique for forming sensors, various changes may be made to FIGS. 2A through 2F. For example, any other suitable techniques could be used to form the various structures of the sensors 100, and the operations shown in FIGS. 2A through 2F could occur in a different order.

Figure 3:
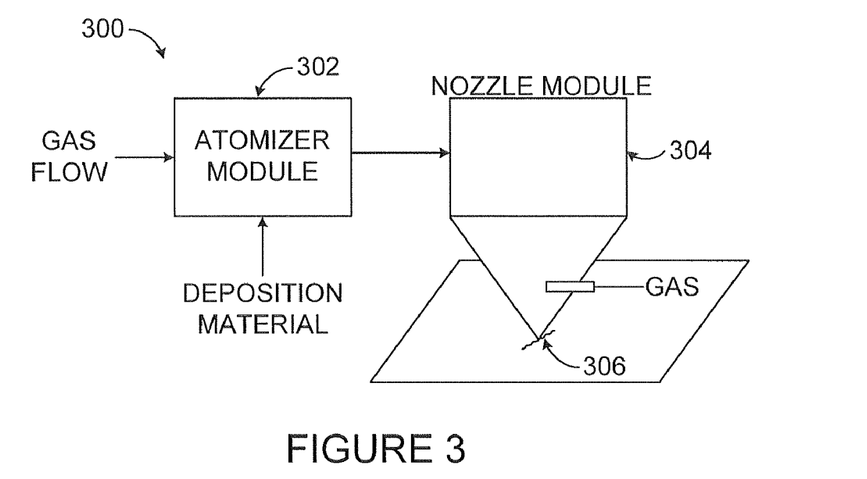
FIG. 3 illustrates an example printing system for additively depositing material on a wafer during sensor formation according to this disclosure.

FIG. 3 illustrates an example printing system 300 for additively depositing material on a wafer during sensor formation according to this disclosure. The embodiment of the printing system 300 shown in FIG. 3 is for illustration only. Other embodiments of the printing system 300 could be used without departing from the scope of this disclosure.

In this example, the printing system 300 represents a direct printing system that can be used to deposit frit glass paste or other deposition material onto a cover wafer or other structure without using a mask. As shown here, the printing system 300 includes an atomizer module 302 and a nozzle module 304. The atomizer module 302 mixes at least one deposition material with a gas flow, producing atomized deposition material that is provided to the nozzle module 304. The nozzle module 304 then removes the gas from the atomized deposition material and deposits the deposition material onto a cover wafer or other structure. In this example, the deposition material is deposited as a liquid line 306 on the cover wafer or other structure.

The use of a direct printing system to deposit frit glass paste or other spacer material onto a cover wafer 202 may be beneficial in several ways. For example, direct printing may require no masking steps to be performed. Also, direct printing may result in little or no paste material being lost during the printing process.

Although FIG. 3 illustrates one example of a printing system 300 for additively depositing material on a wafer during sensor formation, various changes may be made to FIG. 3. For example, other techniques besides direct printing could be used to deposit frit glass paste or other material onto a cover wafer.

Figure 4:
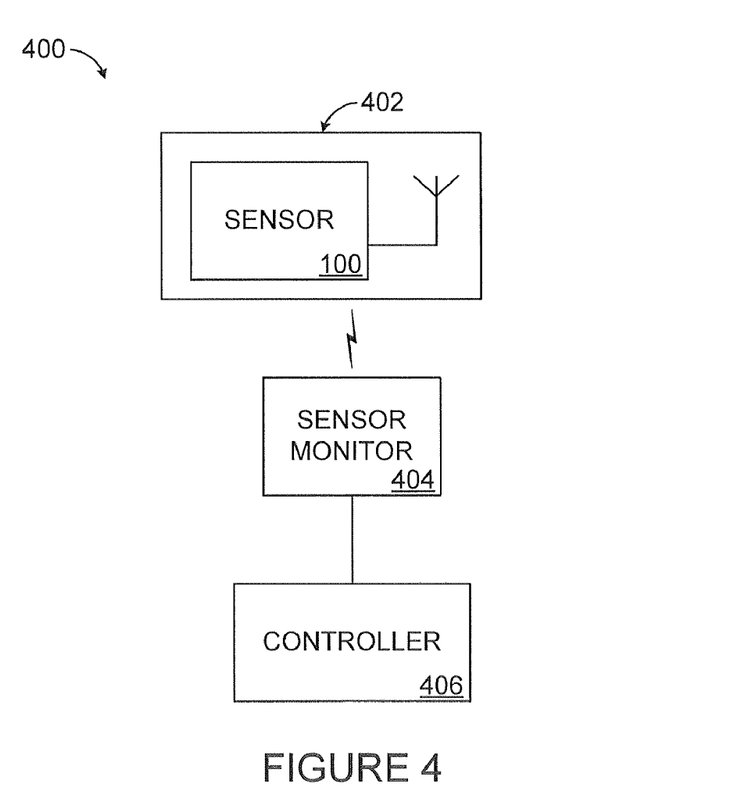
FIG. 4 illustrates an example system using one or more sensors according to this disclosure.

FIG. 4 illustrates an example system 400 using one or more sensors according to this disclosure. The embodiment of the system 400 shown in FIG. 4 is for illustration only. Other embodiments of the system 400 could be used without departing from the scope of this disclosure. Also, for ease of illustration and explanation, the system 400 of FIG. 4 is described with respect to the sensor 100 of FIG. 1. The sensor 100 of FIG. 1 could be used with any suitable system or device.

In this example, the system 400 includes at least one sensor 100 that has been mounted on a printed antenna substrate 402. The printed antenna substrate 402 generally represents a structure on which an antenna has been formed, such as a small printed circuit board with a loop antenna. The antenna allows for wireless transmissions from the sensor 100. The conductive bumps 112a-112b of the sensor 100 may allow the sensor 100 to be "flip chip" mounted to pads of the printed antenna substrate 402. The printed antenna substrate 402 includes any suitable antenna structure. Additional details regarding the attachment of a sensor to an antenna (as wells as details regarding sensors in general) can be found in U.S. patent application Ser. No. 11/286,064 and U.S. patent application Ser. No. 11/331,722, both of which are hereby incorporated by reference.

The sensor 100 is in wireless communication with a sensor monitor 404. The sensor monitor 404 uses the sensor 100 to detect or measure one or more conditions, such as pressure and/or temperature. As a particular example, changes in pressure and/or temperature may alter the operation of the SAW devices 108 in the sensor 100, which may change the wireless signals transmitted by the sensor 100. As a result, the sensor monitor 404 can use the wireless signals from the sensor 100 to detect changes in pressure and/or temperature. The sensor monitor 404 could also process this information further (such as by determining if a low pressure threshold or a high temperature threshold has been reached and triggering an output if so), or the sensor monitor 404 could output the data to a controller 406 for further analysis. The sensor monitor 404 includes any suitable structure for using signals from one or more sensors, such as to extract information or to detect or identify one or more conditions.

The controller 406 controls one or more devices or processes based, at least in part, on outputs of the sensor monitor 404. For example, the controller 406 could represent a vehicle controller, and the controller 406 could use temperature or pressure data to detect problems with a vehicle. If a problem is detected (such as low tire pressure and/or excessive tire temperature), the controller 406 could take any suitable action, such as triggering an audible or visual alarm. The controller 406 includes any hardware, software, firmware, or combination thereof for controlling at least one device, process, or portion thereof based on data from one or more sensors 100.

Each of the connections between components in FIG. 4 could represent any suitable wired or wireless connection. For example, the sensor monitor 404 could be wired to the controller 406. However, any suitable type of connection could be used between components.

Although FIG. 4 illustrates one example of a system 400 using one or more sensors, various changes may be made to FIG. 4. For example, a sensor may communicate with any number of monitors, and each monitor could communicate with any number of sensors. Also, any number of monitors could communicate with any number of controllers. In addition, the functional division shown in FIG. 4 is for illustration only. Various components in FIG. 4 could be combined, subdivided, or omitted and additional components could be added according to particular needs. As a specific example, some or all of the functionality of the sensor monitor could be incorporated into the controller or vice versa.

Figure 5:
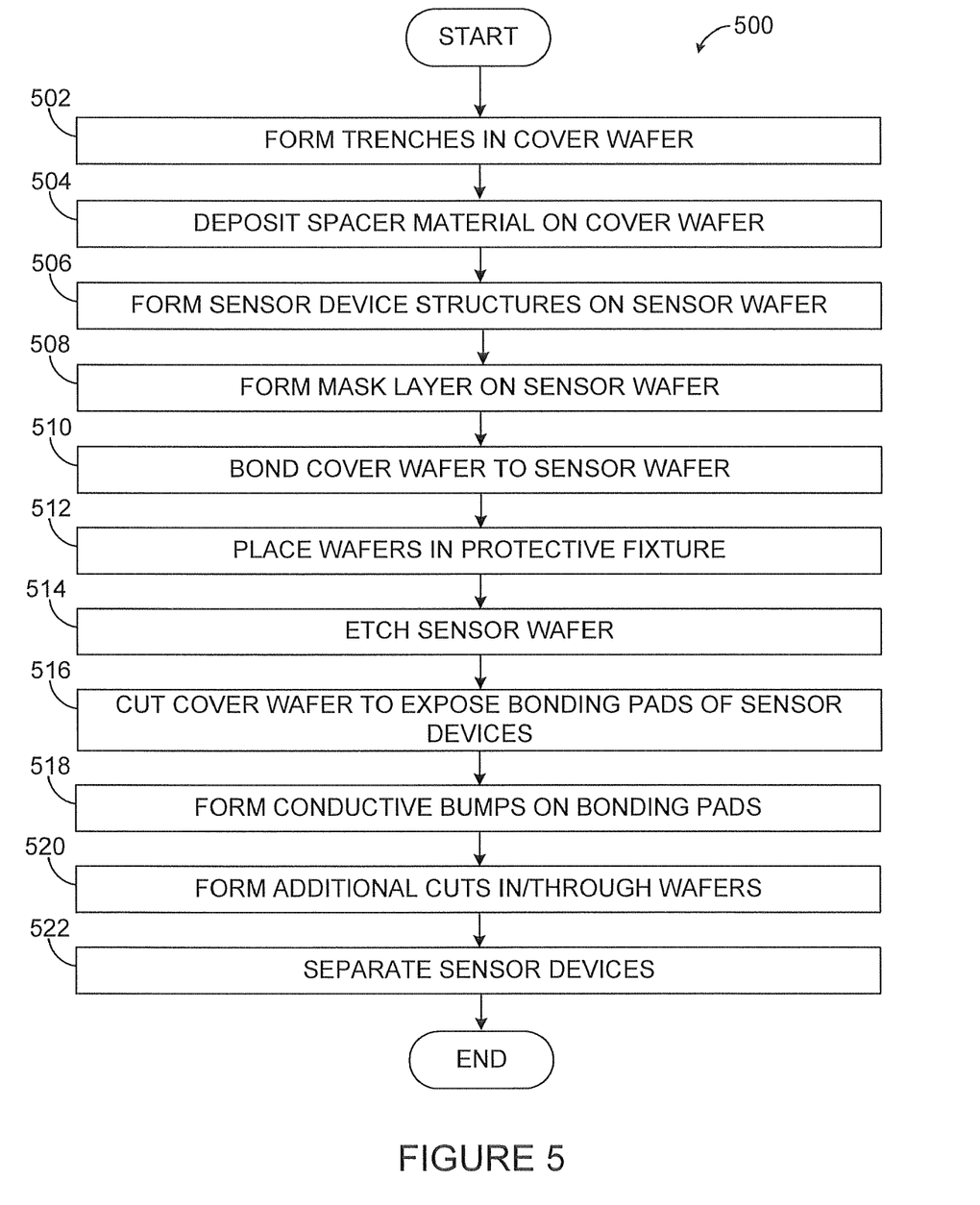
FIG. 5 illustrates an example method for forming a sensor according to this disclosure.

FIG. 5 illustrates an example method 500 for forming multiple packaged sensors according to this disclosure. The embodiment of the method 500 shown in FIG. 5 is for illustration only. Other embodiments of the method 500 could be used without departing from the scope of this disclosure.

One or more trenches are formed in a cover wafer at step 502. This could include, for example, forming multiple trenches 204 in a glass or quartz cover wafer 202. The trenches 204 could be 30-50 μm deep and be formed by sawing. Spacer material is deposited on the cover wafer at step 504. This could include, for example, depositing frit glass paste on the cover wafer 202. The frit glass paste could be deposited using direct or screen printing.

One or more sensor device structures are formed on a sensor wafer at step 506. This could include, for example, forming one or more SAW devices 108 and bonding pads 110a-110b on one side of the sensor wafer 208. The SAW devices 108 and bonding pads 110a-110b could be formed by depositing and etching conductive materials. A mask layer is formed on the sensor wafer at step 508. This could include, for example, depositing silicon or other masking materials on the opposite side of the sensor wafer 208. The silicon layer could be deposited using low temperature plasma enhanced chemical vapor deposition.

The cover wafer and the sensor wafer are bonded at step 510. This could include, for example, aligning the trenches and the frit glass paste or other spacer material on the cover wafer 202 with the SAW devices and their bonding pads on the sensor wafer 208. Any other suitable technique could be used to align the wafers. This may also include pressing the wafers together and curing the spacer material, such as by annealing the frit glass paste to harden the frit glass paste. This may create a hermetically sealed pressure chamber within each sensor device of the multitude of sensors being formed simultaneously on a wafer.

The bonded wafers are placed in a protective fixture at step 512, and the sensor wafer is etched at step 514. This may include, for example, placing the bonded wafers 202 and 208 into the protective fixture 212, which protects all but the exposed side of the sensor wafer 208 from the etch. The etch could represent a wet etch that forms notches 214 in the sensor wafer 208. These notches 214 could have any suitable depth depending, for example, on the thickness of the sensor diaphragms needed in the sensor devices being formed.

The cover wafer is cut to expose the bonding pads of the sensor devices at step 516. This could include, for example, performing two cuts between columns of sensor devices using a sawing disc, where each cut travels completely through locally thinned areas 205 of the cover wafer 202. In other words, these cuts may occur over areas where the trenches 204 were formed in the cover wafer 202. As a result, these cuts may allow strips of the cover wafer 202 to be completely removed without the sawing disc approaching too close to the sensor devices. Conductive bumps are formed on the exposed bonding pads at step 518. This may include, for example, gold wire bonding on the bonding pads 108a-108b of the sensor 100 (such as by thermo-compression of the wire on the bonding pads), followed by wire cutting to produce the final gold stud bump on each bonding pad.

Additional cuts are formed in or through the bonded wafers at step 520. This may include, for example, performing a cut between rows of sensor devices using a sawing disc. These cuts may travel completely through the cover wafer 202 and partially through the sensor wafer 208. This may also include performing a cut between columns of sensor devices through the strips of the cover wafer 202 that have been removed. Again, these cuts may travel partially through the sensor wafer 208. At this point, the sensor wafer 208 has been partially cut between each of the sensor devices, and the sensor devices are separated at step 522. This may include, for example, rolling a heavy mass over the bonded wafers to cause the sensors 100 to separate from one another.

Although FIG. 5 illustrates one example of a method 500 for forming multiple packaged sensors, various changes may be made to FIG. 5. For example, while shown as a series of steps, various steps in FIG. 5 could overlap, occur in parallel, occur in a different order, or occur multiple times. As a particular example, forming of the sensor devices on the sensor wafer could occur before or during formation of the cover wafer.

It may be advantageous to set forth definitions of certain words and phrases used throughout this patent document. The term "couple" and its derivatives refer to any direct or indirect communication between two or more elements, whether or not those elements are in physical contact with one another. The terms "over," "above," and the like denote relative positions of two or more elements in a particular orientation and do not require direct contact between the elements. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. The term "controller" means any device, system, or part thereof that controls at least one operation. A controller may be implemented in hardware, firmware, software, or some combination of at least two of the same. The functionality associated with any particular controller may be centralized or distributed, whether locally or remotely.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A sensor comprising:
   a piezoelectric substrate;
   a surface acoustic wave (SAW) resonator on a first surface of the substrate;
   a bonding pad electrically coupled to the SAW resonator;
   a cover separated from the first surface of the substrate by a spacer, the SAW resonator located between the cover and the substrate; and
   a notch in a second surface of the substrate.

2. The sensor of claim 1, wherein:
   the cover comprises glass; and
   the substrate comprises quartz.

3. The sensor of claim 1, wherein the spacer comprises frit glass having a thermal coefficient of expansion at least approximately equal to average thermal coefficients of expansion for the substrate and the cover.

4. The sensor of claim 1, wherein the spacer and the cover form a pressure chamber within the sensor, the SAW resonator located within the pressure chamber.

5. The sensor of claim 1, further comprising:
   a conductive bump on the bonding pad.

6. A system comprising:
   an antenna; and
   a sensor comprising:
      a piezoelectric substrate;
      a surface acoustic wave (SAW) resonator on a first surface of the substrate;
      a cover separated from the first surface of the substrate by a spacer, the SAW resonator located between the cover and the substrate;
      a notch in a second surface of the substrate;
      multiple bonding pads electrically coupled to the SAW resonator; and
      a conductive bump on each of the bonding pads, the conductive bumps in electrical contact with the antenna.

7. The system of claim 6, further comprising:
   a monitor configured to receive wireless signals from the antenna.

8. The system of claim 7, further comprising:
   a controller configured to analyze data associated with the wireless signals received by the monitor.

9. The system of claim 6, wherein the sensor is associated with a vehicle tire and comprises at least one of: a temperature sensor and a pressure sensor.

10. The system of claim 6, wherein the notch in the second surface of the substrate is located opposite the SAW resonator.

11. The system of claim 10, wherein a thickness of the substrate where at least a portion of the SAW resonator is located is less than a thickness of the substrate away from at least the portion of the SAW resonator.

12. The sensor of claim 1, wherein the notch in the second surface of the substrate is located opposite the SAW resonator.

13. The sensor of claim 12, wherein a thickness of the substrate where at least a portion of the SAW resonator is located is less than a thickness of the substrate away from at least the portion of the SAW resonator.

14. The sensor of claim 1, wherein the bonding pad comprises one of multiple bonding pads electrically coupled to the SAW resonator.

15. A sensor comprising:

a piezoelectric substrate;

a surface acoustic wave (SAW) resonator on a first surface of the substrate;

a bonding pad electrically coupled to the SAW resonator;

a cover, the SAW resonator in a chamber located between the cover and the substrate; and a notch in a second surface of the substrate.

16. The sensor of claim 15, further comprising:

a spacer separating the cover from the first surface of the substrate.

17. The sensor of claim 16, wherein:

the cover comprises glass;

the substrate comprises quartz; and the spacer comprises frit glass having a thermal coefficient of expansion at least approximately equal to average thermal coefficients of expansion for the substrate and the cover.

18. The sensor of claim 15, wherein the notch in the second surface of the substrate is located opposite the SAW resonator.

19. The sensor of claim 18, wherein a thickness of the substrate where at least a portion of the SAW resonator is located is less than a thickness of the substrate away from at least the portion of the SAW resonator.

20. The sensor of claim 15, wherein the bonding pad comprises one of multiple bonding pads electrically coupled to the SAW resonator.

* * * * *